United States Patent
Ken et al.

(10) Patent No.: US 9,748,002 B2
(45) Date of Patent: Aug. 29, 2017

(54) SYSTEM-IN-PACKAGE MODULE WITH MEMORY

(71) Applicant: Etron Technology, Inc., Hsinchu (TW)

(72) Inventors: Weng-Dah Ken, Hsinchu (TW); Chao-Chun Lu, Taipei (TW)

(73) Assignee: Etron Technology, Inc., Hsinchu (TW)

( * ) Notice: Subject to any disclaimer, the term of this patent is extended or adjusted under 35 U.S.C. 154(b) by 7 days.

(21) Appl. No.: 14/522,567

(22) Filed: Oct. 23, 2014

(65) Prior Publication Data

US 2015/0113356 A1    Apr. 23, 2015

Related U.S. Application Data

(60) Provisional application No. 61/894,896, filed on Oct. 23, 2013.

(30) Foreign Application Priority Data

Oct. 23, 2014   (TW) .............................. 103136714 A

(51) Int. Cl.
*G11C 29/02* (2006.01)
*H01L 25/18* (2006.01)
(Continued)

(52) U.S. Cl.
CPC .......... *G11C 29/023* (2013.01); *G06F 11/106* (2013.01); *G11C 5/04* (2013.01); *G11C 11/005* (2013.01); *H01L 25/0657* (2013.01); *H01L 25/18* (2013.01); *H01L 23/3128* (2013.01); *H01L 24/13* (2013.01); *H01L 24/16* (2013.01); *H01L 24/17* (2013.01); *H01L 24/32* (2013.01); *H01L 24/48* (2013.01); *H01L 24/73* (2013.01); *H01L 24/81* (2013.01); *H01L 25/0652* (2013.01); *H01L 25/105* (2013.01); *H01L 2224/131* (2013.01);
(Continued)

(58) Field of Classification Search
CPC ....... G11C 29/023; G11C 5/04; G11C 11/005; G06F 11/106; H01L 25/0657; H01L 25/18
See application file for complete search history.

(56) References Cited

U.S. PATENT DOCUMENTS 5,936,953 A * 8/1999 Simmons ............ G06F 13/4018
370/257
6,069,793 A * 5/2000 Maruyama ................ G06F 1/20
165/104.33
(Continued)

FOREIGN PATENT DOCUMENTS

JP   63039057 A  *  2/1988
JP   04276414 A  * 10/1992
(Continued)

*Primary Examiner* — Cynthia Britt
*Assistant Examiner* — Dipakkumar Gandhi
(74) *Attorney, Agent, or Firm* — Winston Hsu

(57) ABSTRACT

A system-in-package module with memory includes a non-memory chip, a substrate, and a memory chip. The non-memory chip has a first portion and a second portion. The substrate has a window and the substrate is electrically connected to the second portion of the non-memory chip. The memory chip is placed into the window of the substrate to electrically connect the first portion of the non-memory chip, and there is no direct metal connection between the memory chip and the substrate.

11 Claims, 16 Drawing Sheets

(51) Int. Cl.
*G06F 11/10* (2006.01)
*G11C 5/04* (2006.01)
*G11C 11/00* (2006.01)
*G11C 29/52* (2006.01)
*H01L 23/00* (2006.01)
*H01L 23/31* (2006.01)
*H01L 25/065* (2006.01)
*H01L 25/10* (2006.01)

(52) U.S. Cl.
CPC ............ *H01L 2224/13147* (2013.01); *H01L 2224/16145* (2013.01); *H01L 2224/16146* (2013.01); *H01L 2224/16225* (2013.01); *H01L 2224/17181* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73207* (2013.01); *H01L 2224/73253* (2013.01); *H01L 2224/73265* (2013.01); *H01L 2224/81193* (2013.01); *H01L 2225/0651* (2013.01); *H01L 2225/06513* (2013.01); *H01L 2225/06517* (2013.01); *H01L 2225/06541* (2013.01); *H01L 2225/06568* (2013.01); *H01L 2225/06589* (2013.01); *H01L 2225/1023* (2013.01); *H01L 2225/1058* (2013.01); *H01L 2924/00014* (2013.01); *H01L 2924/10253* (2013.01); *H01L 2924/1431* (2013.01); *H01L 2924/1434* (2013.01); *H01L 2924/1436* (2013.01); *H01L 2924/1437* (2013.01); *H01L 2924/15151* (2013.01); *H01L 2924/15311* (2013.01); *H01L 2924/181* (2013.01); *H01L 2924/1815* (2013.01); *H01L 2924/18161* (2013.01)

(56) References Cited

U.S. PATENT DOCUMENTS

| | | | | |
|---|---|---|---|---|
| 7,246,192 | B1* | 7/2007 | Chang | G06F 13/387 710/311 |
| 2004/0056104 | A1* | 3/2004 | Osawa | B29C 45/14647 235/492 |
| 2006/0006525 | A1* | 1/2006 | Mullen | H01L 23/3677 257/712 |
| 2007/0260914 | A1* | 11/2007 | Pogrebinsky | G06F 11/0745 714/5.11 |
| 2008/0320227 | A1* | 12/2008 | Miura | G06F 11/1064 711/133 |
| 2009/0278265 | A1* | 11/2009 | Imanishi | H01L 21/56 257/787 |
| 2009/0321959 | A1* | 12/2009 | Hedler | H01L 23/5385 257/777 |
| 2010/0117713 | A1* | 5/2010 | Katoh | H03K 17/693 327/427 |
| 2010/0128539 | A1* | 5/2010 | Kobayashi | G11C 7/1045 365/189.05 |
| 2011/0072212 | A1* | 3/2011 | Kojima | G06F 12/0811 711/119 |
| 2011/0163745 | A1* | 7/2011 | Faehler | F03G 7/065 324/252 |
| 2012/0136596 | A1* | 5/2012 | Yamaoka | H01L 23/5286 702/64 |
| 2012/0173809 | A1* | 7/2012 | Ko | G06F 12/0893 711/105 |
| 2013/0141858 | A1* | 6/2013 | Pyeon | G06F 1/18 361/679.31 |

FOREIGN PATENT DOCUMENTS

| | | | | |
|---|---|---|---|---|
| JP | 2006048731 A | * | 2/2006 | |
| KR | 20010091916 A | * | 10/2001 | .......... H01L 21/563 |
| TW | 513802 | | 12/2002 | |
| TW | 201340262 A | | 10/2013 | |

* cited by examiner

SYSTEM-IN-PACKAGE MODULE WITH MEMORY

CROSS REFERENCE TO RELATED APPLICATIONS

This application claims the benefit of U.S. Provisional Application No. 61/894,896, filed on Oct. 23, 2013 and entitled "Embedded memory," the contents of which are incorporated herein by reference.

BACKGROUND OF THE INVENTION

1. Field of the Invention

The present invention relates to a system-in-package (SIP) module with memory, and particularly to a SIP module that integrates a cache memory with an embedded dynamic random access memory (DRAM).

2. Description of the Prior Art

Generally speaking, memories are usually designed as standard memories which are independent from application logic integrated circuits (ICs) based on certain industry standard (e.g. Joint Electronic Device Engineering Council, JEDEC is the exemplary one). That is to say, the memories are designed typically as standard memories for various application logic ICs based on the certain industry standard, but not for predetermined application logic ICs.

In an application logic IC, the application logic IC needs a memory controller to control communication between a standard memory and the application logic IC. Because the memory controller needs to communicate with various different standard memories, the memory controller is usually designed to have suboptimal performance, efficiency, and/or cost to respond the various different standard memories.

However, memory manufacturers intend to provide known good die memories, so the application logic IC only needs to communicate with the known good die memories. Meanwhile, if the memory controller is still designed to have suboptimal performance, efficiency, and/or cost to respond the various different standard memories, a system-in-package (SIP) module which includes the application logic IC, the known good die memories, and the memory controller cannot maximize performance thereof.

SUMMARY OF THE INVENTION

An embodiment provides a system-in-package (SIP) module with memory. The SIP module includes a cache memory, a memory controller, a memory, and a substrate, wherein the cache memory, the memory controller, and the memory are co-packaged over the substrate, and the cache memory and the memory controller are formed on a same semiconductor chip.

Another embodiment provides a SIP module with memory. The SIP module includes a non-memory chip, a memory controller, a memory, and a substrate, wherein the non-memory chip, the memory controller, and the memory are co-packaged over the substrate, and the memory and the memory controller are formed on a same semiconductor chip.

Another embodiment provides a SIP module with memory. The SIP module includes a non-memory chip, a substrate, and a memory. The non-memory chip has a first portion and a second portion. The substrate has a window and the substrate is electrically connected to the second portion of the non-memory chip. The memory is installed into the window of the substrate to electrically connect the first portion of the non-memory chip, and there is no direct metal connection between the memory chip and the substrate.

Another embodiment provides a SIP module with memory. The SIP module includes a non-memory chip, a substrate, and a memory. The non-memory chip has a first portion and a second portion, wherein the non-memory chip includes a plurality of first electrical contacts and a plurality of second electrical contacts, and the plurality of first electrical contacts and the plurality of second electrical contacts are installed on the first portion and the second portion of the non-memory chip, respectively. The memory has a plurality of third electrical contacts installed on one side thereof. The substrate has a plurality of fourth electrical contacts installed on one side thereof. The plurality of first electrical contacts are electrically connected to the plurality of third electrical contacts to make the memory be electrically connected to the non-memory chip, the plurality of second electrical contacts are electrically connected to the plurality of fourth electrical contacts to make the substrate be electrically connected to the non-memory chip, and the substrate and the memory are both electrically connected to the same side of the non-memory chip or electrically connected to different sides of the non-memory chip.

The present invention provides a SIP module with memory. The SIP module integrates a memory (embedded dynamic random access memory), a non-memory chip (logic integrated circuit), and a substrate into a system-in-package, so the present invention can reduce an area of the SIP module. In addition, because the SIP module provided by the present invention can be customized to respond various different memories (embedded dynamic random access memory) and non-memories (logic integrated circuit), the SIP module provided by the present invention has an optimal performance, efficiency, or cost.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
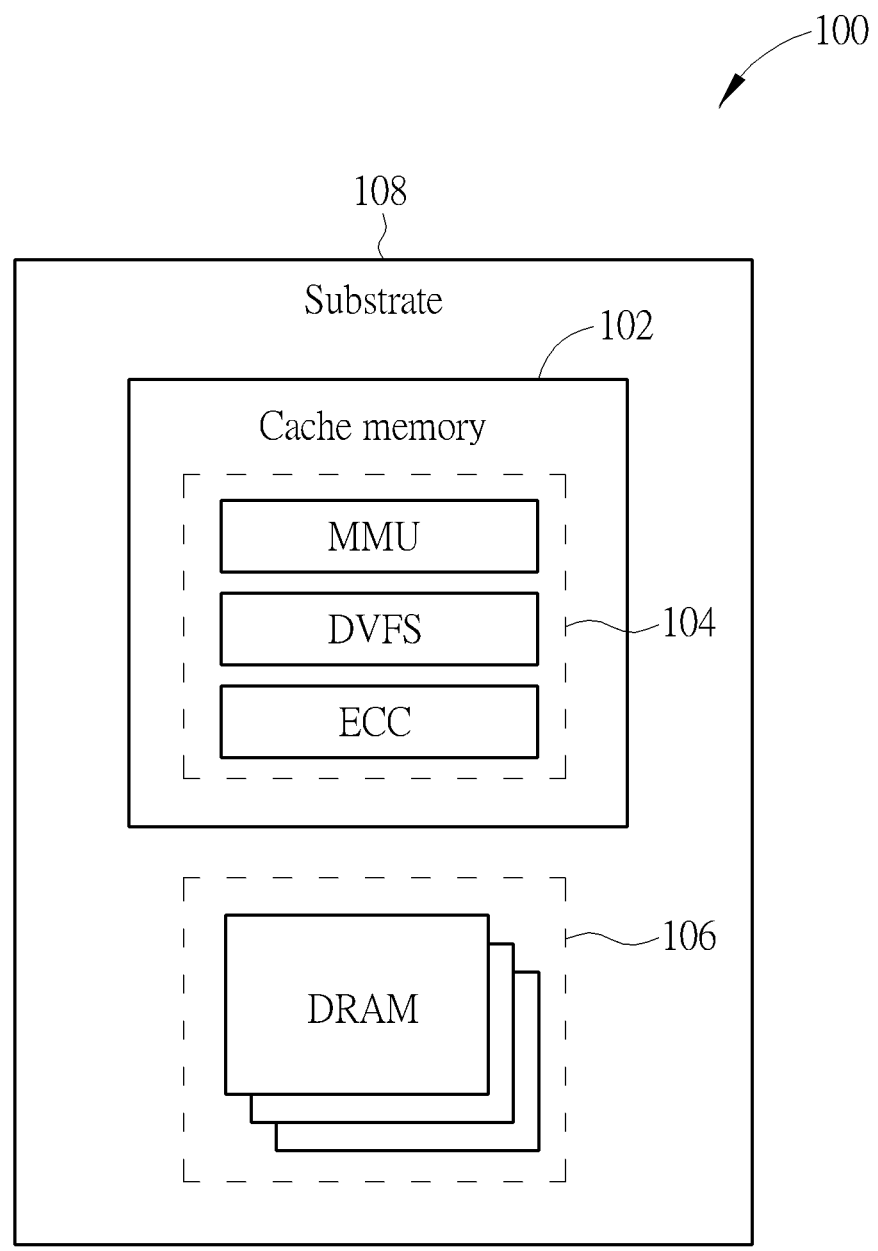
FIG. 1 is a diagram illustrating a system-in-package module with memory according to a first embodiment.

Please refer to FIG. 1. FIG. 1 is a diagram illustrating a system-in-package (SIP) module 100 with memory according to a first embodiment. As shown in FIG. 1, the SIP module 100 includes a cache memory 102, a memory controller 104, a dynamic random access memory (DRAM) 106, and a substrate 108, wherein the DRAM 106 (a main memory within the SIP module 100) can be an DRAM (DRAM), or a plurality of DRAM assembled or stacked together. In addition, the cache memory 102, the memory controller 104, and the memory 106 are co-packaged over the substrate 108, and the cache memory 102 and the memory controller 104 are formed on a same semiconductor chip, wherein the same semiconductor chip is a Si chip made according to a complementary metal-oxide-semiconductor (CMOS) process. The cache memory 102 can be a static random access memory (SRAM) or a DRAM whose operation speed or bandwidth is higher than operation speed of the DRAM 106. For example, an operation speed or a bandwidth of the cache memory 102 is three times or more higher than an operation speed or a bandwidth of the DRAM 106. The cache memory 102 and the DRAM 106 can be installed on the substrate 108 respectively, or be installed on the substrate 108 after the cache memory 102 and the DRAM 106 are stacked together. The substrate 108 can be a soft organic substrate or regular print circuit board (PCB) substrate (e.g. Ball Grid Array (BGA)) substrate.

As shown in FIG. 1, the memory controller 104 is a part of the cache memory 102. But, in another embodiment of the present invention, the memory controller 104 can be separate outside the cache memory 102. As shown in FIG. 1, the memory controller 104 includes a cache management unit MMU, a dynamic voltage frequency scaling unit DVFS, and an error correcting code unit ECC. According to commands of the SIP module 100, the cache management unit MMU controls to read (or write) data from (or to) either the cache memory 102 or the DRAM 106. The error correcting code unit ECC can correct data error(s) stored in the cache memory 102 or the DRAM 106. The dynamic voltage frequency scaling unit DVFS can dynamically change a combination of operation voltages, operation frequencies, and bus widths of the SIP module 100.

Figure 2:
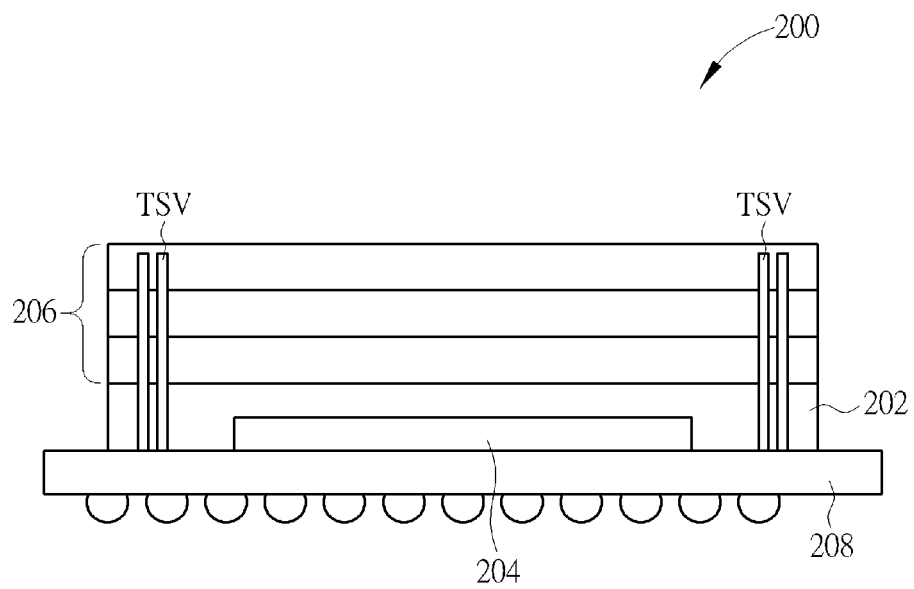
FIG. 2 is a diagram illustrating a SIP module with memory according to a second embodiment.

Please refer to FIG. 2. FIG. 2 is a diagram illustrating a SIP module 200 with memory according to a second embodiment. As shown in FIG. 2, a DRAM 206 (main memory) includes a plurality of DRAMs stacked together and the DRAM 206 is installed on a cache memory 202 and electrically connected to the cache memory 202 through silicon vias (TSVs). As shown in FIG. 2, the cache memory 202 includes a memory controller 204 and is installed on a substrate 208, wherein an operation speed or a bandwidth of the cache memory 202 is three times or more higher than an operation speed or a bandwidth of the DRAM 206. However, a storage size of the DRAM 206 is three times higher than a storage size of the cache memory 202. In addition, based on the same access times to the DRAM 206 and to the cache memory 202, power consumption of the DRAM 206 is three times higher than power consumption of the cache memory 202. In addition, the present invention is not limited to the operation speed or the bandwidth of the cache memory 202 being three times or more higher than the operation speed or the bandwidth of the DRAM 206 and the storage size of the DRAM 206 being three times or more higher than the storage size of the cache memory 202.

Figure 3:
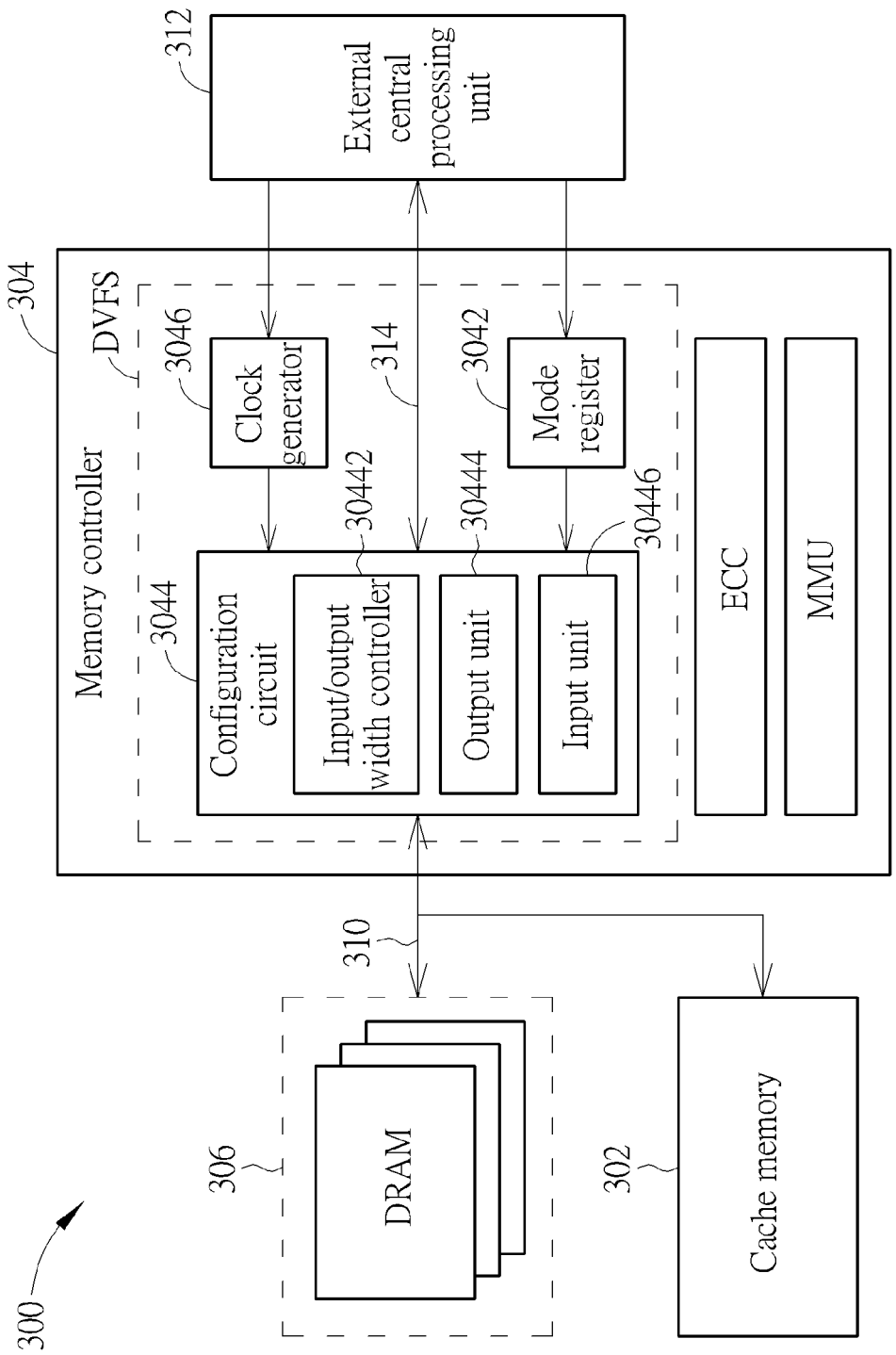
FIG. 3 is a diagram illustrating a SIP module with memory according to a third embodiment.

Please refer to FIG. 3. FIG. 3 is a diagram illustrating a SIP module 300 with memory according to a third embodiment. As shown in FIG. 3, a dynamic voltage frequency scaling unit DVFS of a memory controller 304 can access a DRAM 306 through a first reconfigurable bus (e.g. 128, 256 or more bits wide bus) 310 between the memory controller 304 and the DRAM 306, and converts first reconfigurable bus data into second reconfigurable bus data to an external central processing unit (or other logic integrated circuit (IC)) 312. A mode register 3042 of the dynamic voltage frequency scaling unit DVFS can reconfigure needed memory channels, granularity, frequencies, data swing voltages, or data bandwidth of the first reconfigurable bus 310 or the second reconfigurable bus 314 in relatively fast turnaround time. For example, when four DRAM dies of 512Mx32 bit stacked/packed together in the DRAM 306, the DRAM 306 can be set as the DRAM 306 with 1Gx64 bits or 512Mx128 bits according to contents of the mode register 3042.

As shown in FIG. 3, the dynamic voltage frequency scaling unit DVFS further includes a configuration circuit 3044 and a clock generator 3046. As shown in FIG. 3, the mode register 3042 can be set by the external central processing unit (or other logic IC) 312, and the configuration circuit 3044 can control and reconfigure the first reconfigurable bus 310 between the DRAM 306 and the memory controller 304 according to the contents of the mode register 3042. For example, when the DRAM 306 has four DRAM of 512Mx32 bit stacked together, a bus width of the first reconfigurable bus 310 can be set as 32 bits, 64 bits, or 128 bits, and address width thereof can be set as 2G, 1G, or 512M, respectively.

As shown in FIG. 3, the configuration circuit 3044 includes an input/output width controller 30442, an output unit 30444, and an input unit 30446. The input/output width controller 30442 can access the contents of the mode register 3042, and configure the first reconfigurable bus 310 or the second reconfigurable bus 314. Therefore, the present invention can realize different bus width configurations. For example, in one embodiment of the present invention, the bus width of the first reconfigurable bus 310 is configured as M bits and a swing voltage (which is equal to a voltage difference between a logic-high "1" and a logic-low "0") of the first reconfigurable bus 310 is configured as 1.8V, and a bus width of the second reconfigurable bus 314 is configured as N bits and a swing voltage of the second reconfigurable bus 314 is configured as 1.2V. The output unit 30444 of the configuration circuit 3044 receives M bits data of the first reconfigurable bus 310 and then outputs N bits data to the second reconfigurable bus 314 according to clock signals generated from the clock generator 3046. Meanwhile, the output unit 30444 can also reduce a swing voltage of the M bits data from 1.8V to 1.2V (or lower). Therefore, the output unit 30444 can receive the M bits data with 1.8V swing voltage from either the DRAM 306 (or the cache memory 302) through the first reconfigurable bus 310, and then generate and transmit the N bits data with 1.2V swing voltage to the external central processing unit 312 through the second reconfigurable bus 314 between the external central processing unit 312 and the memory controller 304.

On the other hand, as shown in FIG. 3, the input unit 30446 of the configuration circuit 3044 is used for receiving parallel N bits data with 1.2V swing voltage from the external central processing unit 312 through the second reconfigurable bus 314, converting the parallel N bits data with 1.2V swing voltage into another format which is parallel M bits data with 1.8V swing voltage to the first reconfigurable bus 310, and writing the parallel M bits data with 1.8V swing voltage to either the DRAM 306 (or the cache memory 302) through the first reconfigurable bus 310.

Meanwhile, an operation frequency of either the first reconfigurable bus 310 or the second reconfigurable bus 314 is also changeable according to the contents of the mode register 3042, and the clock generator 3046 of the dynamic voltage frequency scaling unit DVFS can control a reference frequency of the first reconfigurable bus 310 or the second reconfigurable bus 314.

Figure 4A:
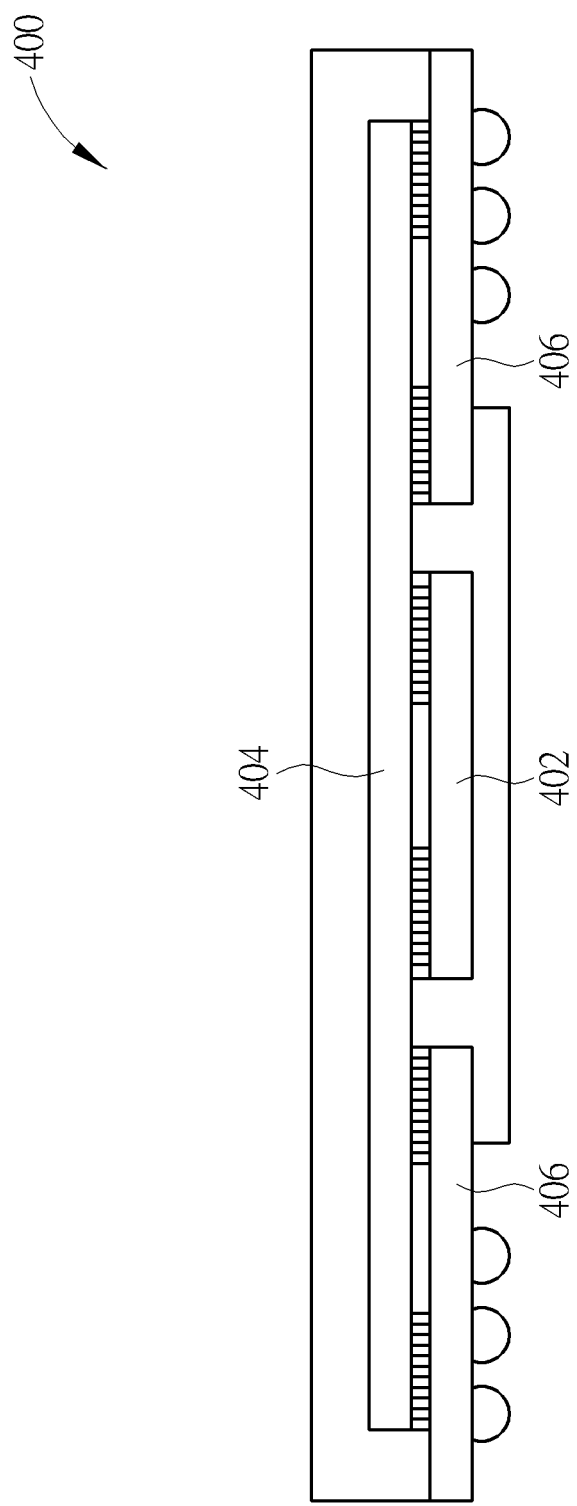
FIG. 4A is a diagram illustrating a SIP module with memory according to a fourth embodiment.
Figure 4B:
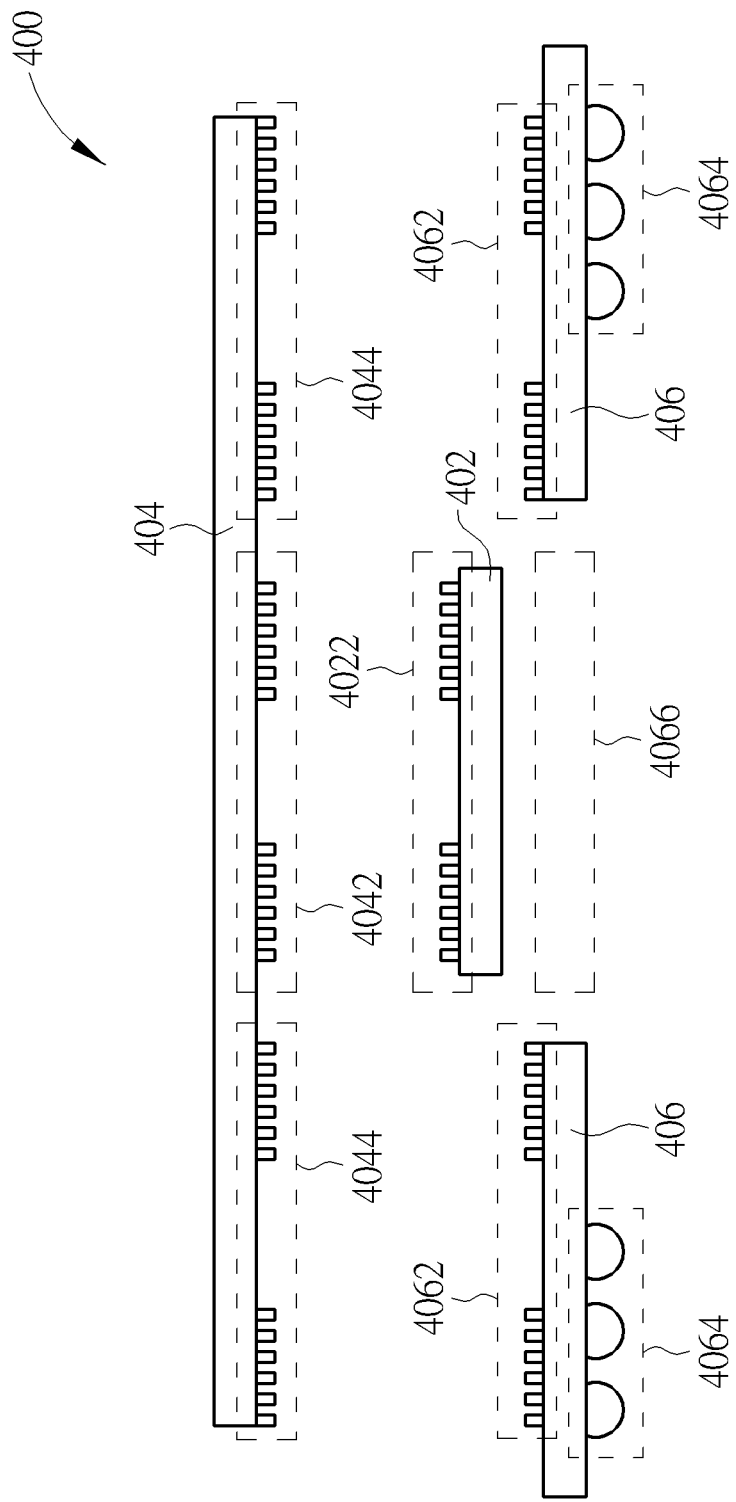
FIG. 4B is an explosion diagram illustrating the SIP module.
Figure 4C:
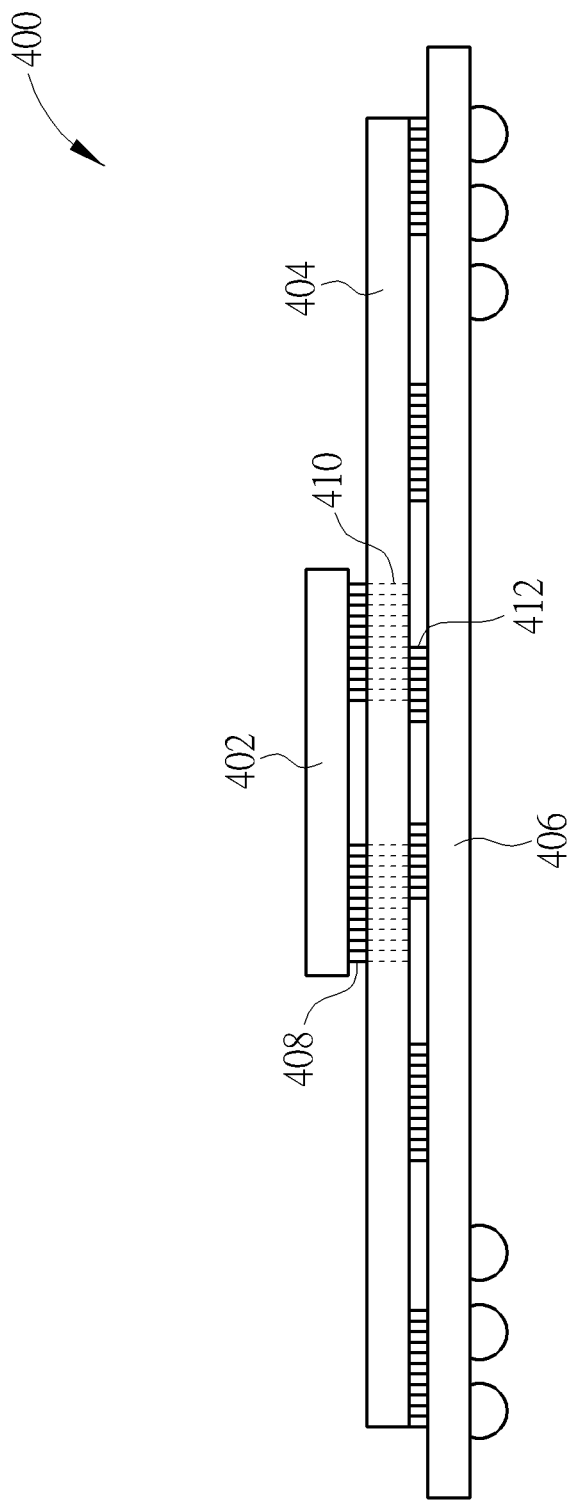
FIG. 4C is a diagram illustrating a SIP module with memory according to a fifth embodiment.

Please refer to FIGS. 4A-4C. FIG. 4A is a diagram illustrating a SIP module 400 with memory according to a fourth embodiment, FIG. 4B is an explosion diagram illustrating the SIP module 400, and FIG. 4C is a diagram illustrating a SIP module 450 with memory according to a fifth embodiment. As shown in FIG. 4A, the SIP module 400 corresponds to a dual die flat (DDF) BGA package with embedded DRAM (DRAM), wherein the SIP module 400 includes a memory 402, a non-memory chip 404, and a substrate 406. The memory 402 can be a known good die memory (KGDM) or a plurality of KGDM assembled or stacked together. The non-memory chip 404 can be a logic IC, such as a central processing unit. The substrate 406 can be a soft organic substrate or a regular print circuit board, such as a (BBGA) substrate.

The non-memory chip (or logic IC) 404 has a central portion and a peripheral portion. As shown in FIG. 4B, a plurality of first electrical contacts 4042 and a plurality of second electrical contacts 4044 of the non-memory chip 404 are installed on the central portion and the peripheral portion of the non-memory chip 404 respectively, wherein each of the plurality of first electrical contacts 4042 and the plurality of second electrical contacts 4044 can be a solder ball or a copper pillar. As shown in FIG. 4B, the memory 402 includes a plurality of third electrical contacts 4022 installed on one side thereof, and the substrate 406 also includes a plurality of fourth electrical contacts 4062 on one side thereof and a plurality of fifth electrical contacts 4064 on other side thereof. As shown in FIG. 4B, because the plurality of first electrical contacts 4042 are electrically connected to the plurality of third electrical contacts 4022, the memory 402 can be electrically connected to the central portion of the non-memory chip 404, and because the plurality of second electrical contacts 4044 are electrically connected to the plurality of fourth electrical contacts 4062, the substrate 406 can be electrically connected to the peripheral portion of the non-memory chip 404. Therefore, as shown in FIG. 4A, the memory 402 is installed underneath the central portion of the non-memory chip 404 and the substrate 406 is installed underneath the peripheral portion of the non-memory chip 404.

As shown in FIG. 4B, the substrate 406 further includes a hollow space (or window) 4066, wherein the memory 402 is installed into the hollow space 4066 of the substrate 406 to electrically connect to the non-memory chip 404. Therefore, the substrate 406 and the memory 402 are both couples to the same side of the non-memory chip 404. Thus, as shown in FIG. 4A, there is no direct metal connection between the memory 402 and the substrate 406. In addition, the SIP module 400 can be installed on an external print circuit board (non-shown in FIG. 4B) and is electrically connected to the external print circuit board through the plurality of fifth electrical contacts 4064 electrically of the substrate 406.

As shown in FIG. 4C, a memory 402 of the SIP module 450 is installed above a non-memory chip 404 of the SIP module 450 and electrical connected to the non-memory chip 404 through a face-to-face bumping structure 408, and the memory 402 is electrical connected to the substrate 406 through the face-to-face bumping structure 408 and a TSV 410. The non-memory chip 404 is electrical connected to the substrate 406 through another face-to-face bumping structure 412.

Figure 5:
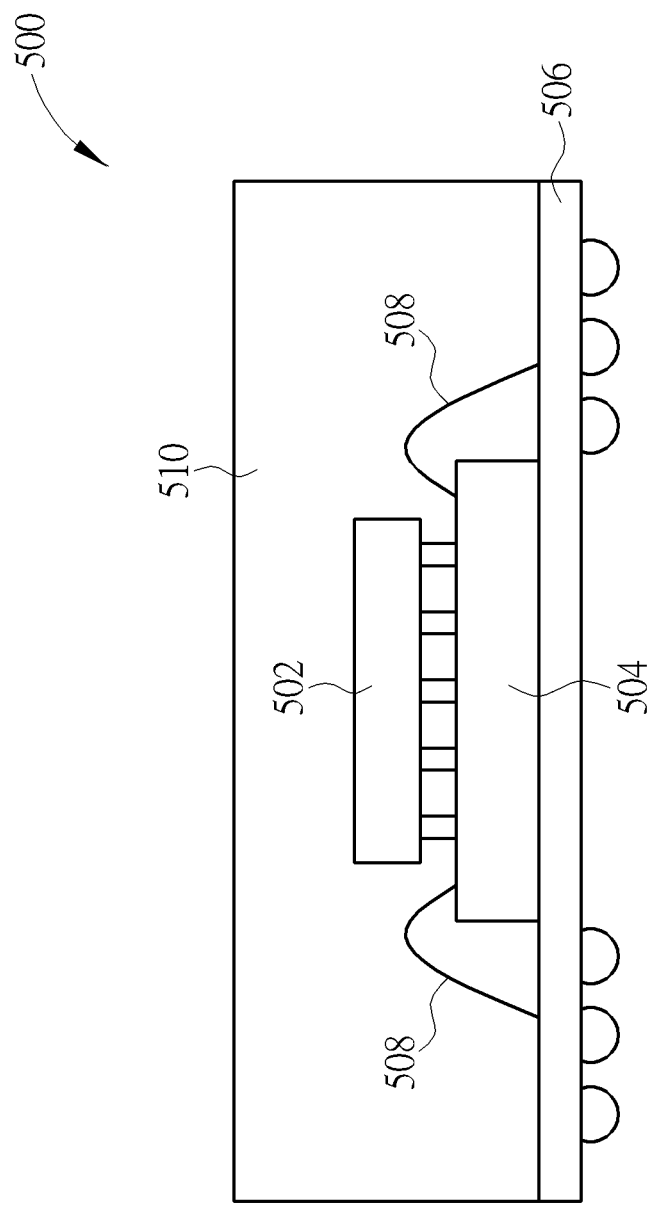
FIG. 5 is a diagram illustrating a SIP module with memory according to a sixth embodiment.

Please refer to FIG. 5. FIG. 5 is a diagram illustrating a SIP module 500 with memory according to a sixth embodiment. As shown in FIG. 5, wire-bonds 508 exist between an active device area surface of a non-memory chip 504 (logic IC) and a substrate 506 of the SIP module 500, and a memory 502 (DRAM) of the SIP module 500 can be electrically connected to the non-memory chip 504 (logic IC) through a face-to-face bumping structure. The bumping structures corresponds to a soldering or bumping process, wherein the soldering or bumping process includes a solder bump step, a copper to copper bump or other like bumping process steps. In addition, a molding material 510 can be formed on a top of the memory 502 (DRAM) and a portion of the substrate 506, wherein the molding material 510 can cover the memory 502 (DRAM) and the non-memory chip 504 (logic IC). In addition, the non-memory chip 504, a memory controller, and the memory 502 are co-packaged over the substrate 506, and the memory 502 and the memory controller are formed on a same semiconductor chip.

Figure 6:
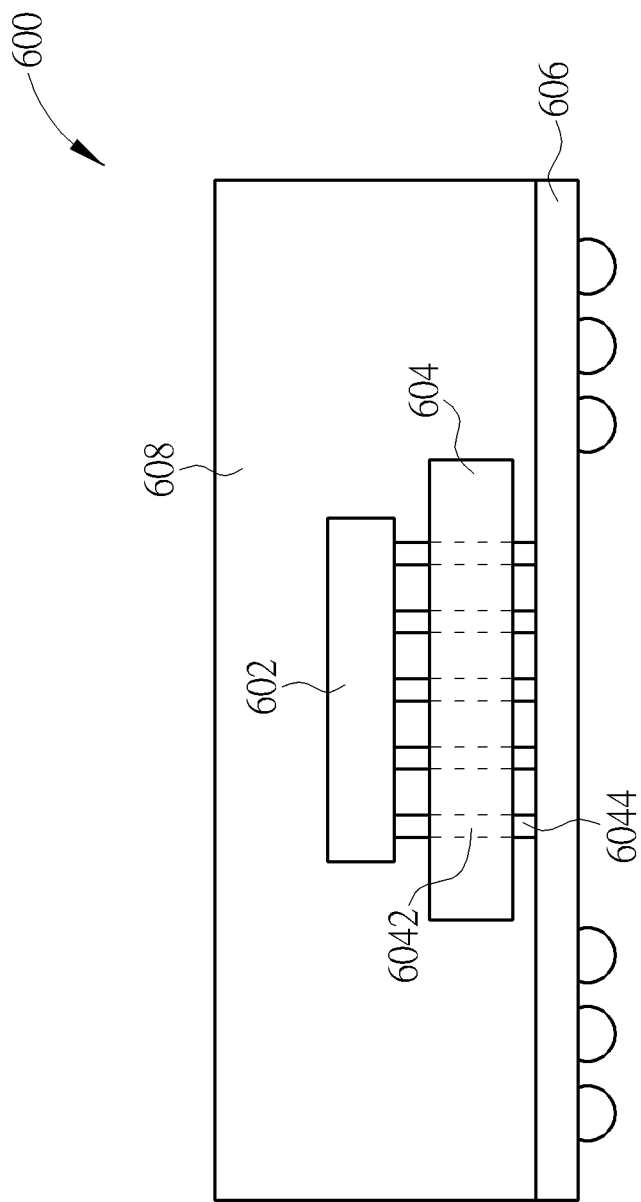
FIG. 6 is a diagram illustrating a SIP module with memory according to a seventh embodiment.

Please refer to FIG. 6. FIG. 6 is a diagram illustrating a SIP module 600 with memory according to a seventh embodiment. As shown in FIG. 6, a non-memory chip 604 (logic IC) of the SIP module 600 has through silicon via (TSV) 6042, wherein an active device area of the non-memory chip 604 (logic IC) is electrically connected to a substrate 606 of the SIP module 600 through a bumping structure 6044. The bumping structure 6044 shown in FIG. 6 includes a solder bump step, a copper to copper bump, or other like bumping process steps. A memory 602 (DRAM) of the SIP module 600 can be electrically connected to a backside (Si substrate) of the non-memory chip 604 (logic IC) through the TSV 6042 and the bumping structures 6044. In addition, a molding material 608 can be formed on a top of the memory 602 and a portion of the substrate 606, wherein the molding material 608 can cover the memory 602 and the non-memory chip 604 (logic IC). In addition, in another embodiment of the present invention, the top of the memory 602 or a portion of the non-memory chip 604 (logic IC) can be open space not covered by the molding material 608. In addition, a heat sink or a heat spreader can be installed on the top of the memory 602 or the portion of the non-memory chip 604 (logic IC) to make the memory 602 or the non-memory chip 604 (logic IC) dissipate heat from the memory 602 or the non-memory chip 604 (logic IC) more effectively and preventing from over-heating of the memory 602 or the non-memory chip 604 (logic IC) while the memory 602 or the non-memory chip 604 (logic IC) operate.

Figure 7:
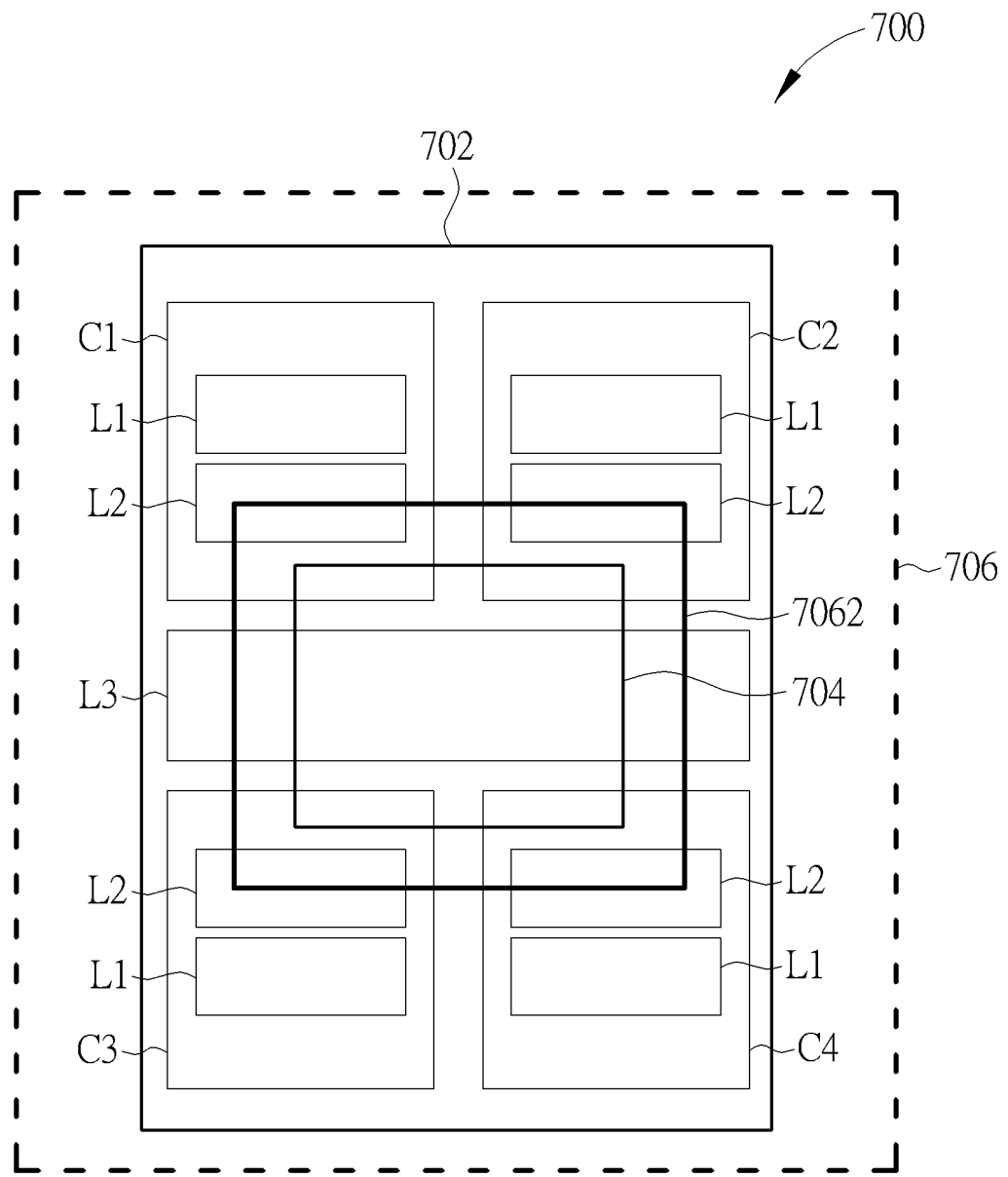
FIG. 7 is a diagram illustrating a SIP module with memory according to an eighth embodiment.

Please refer to FIG. 7. FIG. 7 is a diagram illustrating a SIP module 700 with memory according to an eighth embodiment. As shown in FIG. 7, a non-memory chip 702 of the SIP module 700 is a central processing unit with multiple cores, such as Intel® Haswell central processing unit (four cores central processing unit). Each core of four cores C1-C4 of the non-memory chip 702 includes an internal level 1 cache memory L1 and an internal level 2 cache memory L2, and the non-memory chip 702 further includes an additional internal level 3 cache memory L3 shared by each of the four cores C1-C4 (as shown in FIG. 7). A memory 704 of the SIP module 700 can be one DRAM or a plurality of DRAM stacked together, wherein the memory 704 can act as an external level 4 cache of the non-memory chip 702. As shown in FIG. 7, a substrate 706 is a BGA substrate with a window 7062, and the memory 704 is installed in the window 7062 to electrically connect to the non-memory chip 702. In another embodiment of the present invention, the four cores C1-C4 of the non-memory chip 702 can have a plurality of calculation functions, wherein a few cores of the four cores C1-C4 of the non-memory chip 702 are applied to general purpose computing usages (i.e. central processing unit core functions and the like) and other few cores of the four cores C1-C4 of the non-memory chip 702 are applied to graphic, display or high bandwidth computing usage purposes (i.e. graphic processing unit (GPU) core functions and the like). In addition, the memory 704 can be partitioned into a few working channels or lanes, wherein a fixed number of bits per channels or lanes are predefined according to the last level cache memory work load under a given hardware configurations. In another embodiment of the present invention, the memory 704 includes a plurality of memory arrays, wherein the plurality of memory arrays can be dynamically allocated to different cores of the four cores C1-C4 according to work load of each of cores of the four cores C1-C4 corresponding to the central processing unit or cores of the four cores C1-C4 corresponding to the graphic processing unit. For example, more than 50-80% of the plurality of memory arrays are allocated to one or more cores of the four cores C1-C4 corresponding to the graphic processing unit according to work load coming from different software applications, and less than 50%-80% of the plurality of memory arrays are occupied to one or more cores of the four cores C1-C4 corresponding to the central processing unit according to lighter work load requirement. Because the plurality of memory arrays can be dynamically allocated to different cores of the four cores C1-C4 according to work load of each of the cores of the four cores C1-C4 corresponding to the central processing unit or the cores of the four cores C1-C4 corresponding to the graphic processing unit, a cache memory scheme of the memory 704 can save standby power or active power of the memory 704 and lengthen battery life of common electronics devices, such as note-book personal computers (PC), hand-held computing devices, smart phones, tablet PC, or communication system devices. To save yield and cost of the memory 704 during the SIP module 700 production, one or more memory arrays of the plurality of memory arrays of the memory 704 can be disabled by one or more registers built-in on the memory 704, or can be disabled by one or more registers off the memory 704 (that is, one or more memory arrays of the plurality of memory arrays of the memory 704 can be disabled by one or more registers within another circuit). In another embodiment of the present invention, the memory 704 includes one or more memory arrays, wherein the one or more memory arrays are used for ⌈tag memory⌋ purposes along with data cache memory arrays. In another embodiment of the present invention, the memory 704 includes a control logic module, wherein the control logic module is used for controls of cache memory and/or tag memory. When the memory 704 is accessed (read or written) by the cores of the four cores C1-C4 corresponding to the central processing unit or the cores of the four cores C1-C4 corresponding to the graphic processing unit, the control logic module can arrange the cache memory hit/miss processes. The memory 704 further includes one or more SRAM arrays on-chip to play a role of higher speed read/write access purposes. For example, a high speed tag memory can be used for enhancing cache memory read/write access speed performance along with on-chip DRAM arrays, or can be used for acting as a control register to dynamically control operating voltage levels, operating frequency conditions, or allocation of the plurality of memory arrays for the cores of the four cores C1-C4 corresponding to the central processing unit or the cores of the four cores C1-C4 corresponding to the graphic processing unit. The memory 704 further includes an error correcting code unit circuit module, wherein the error correcting code unit circuit module is use for recovering the dynamic faults during read/write access process of the memory 704, or can be used for recovering defective bits or arrays during a semiconductor process. Thus, the memory 704 can get higher production yield and lower cost at the same time.

Figure 8:
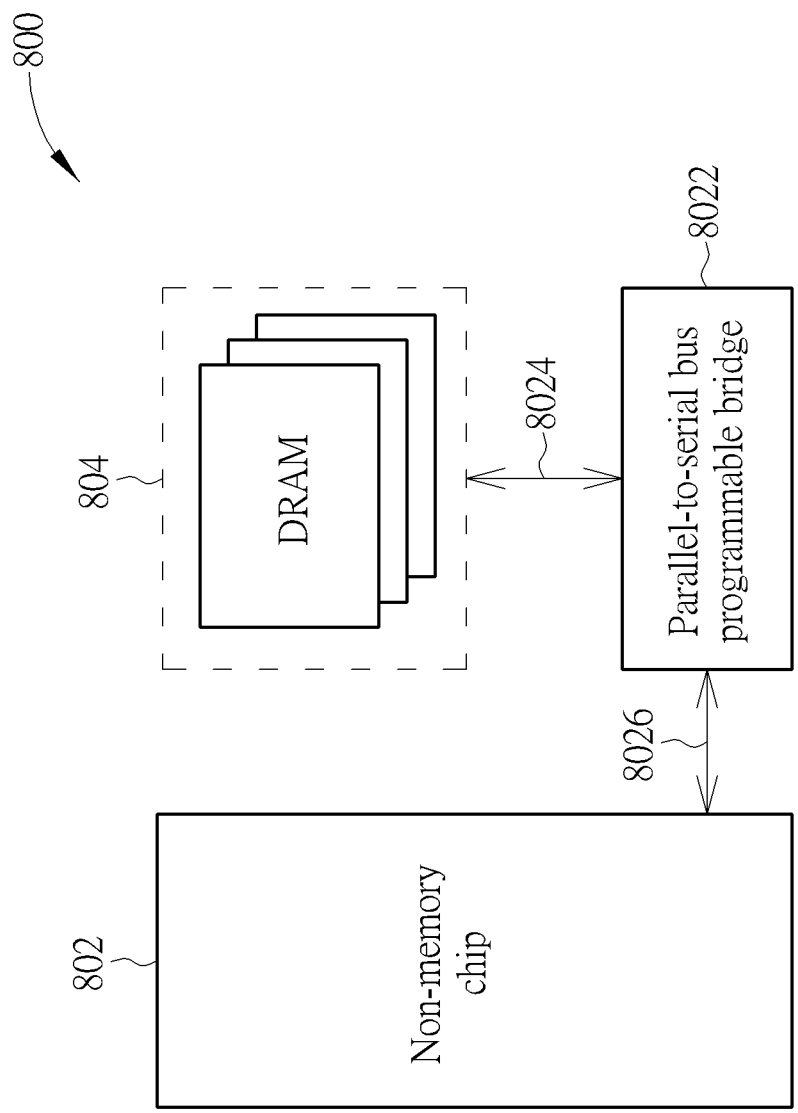
FIG. 8 is a diagram illustrating a SIP module with memory according to a ninth embodiment.

Please refer to FIG. 8. FIG. 8 is a diagram illustrating a SIP module 800 with memory according to a ninth embodiment. As shown in FIG. 8, the SIP module 800 includes a parallel-to-serial bus programmable bridge 8022, wherein the parallel-to-serial bus programmable bridge 8022 can access a memory 804 through a reconfigurable bus 8024 (such as 128, 256 or more bits wide bus) between the parallel-to-serial bus programmable bridge 8022 and the memory 804 and convert wide bus data from the memory 804 into high speed serial bus data. In addition, the parallel-to-serial bus programmable bridge 8022 can transmit the high speed serial bus data to a non-memory chip 802 through a high speed serial bus 8026. A mode register of the parallel-to-serial bus programmable bridge 8022 can reconfigure a combination of memory channels, granularity, power, and data bandwidth needed by the memory 804 in relatively fast turnaround time, such that the memory 804 can be set as a "virtual external cache memory". For example, when four DRAMs of 512Mx32 bit stacked/packed together in the memory 804, the memory 804 (virtual external cache memory) can be set as a 1Gx64 bits or 512Mx128 bits virtual external cache memory according to contents of the mode register of the parallel-to-serial bus programmable bridge 8022.

Figure 9:
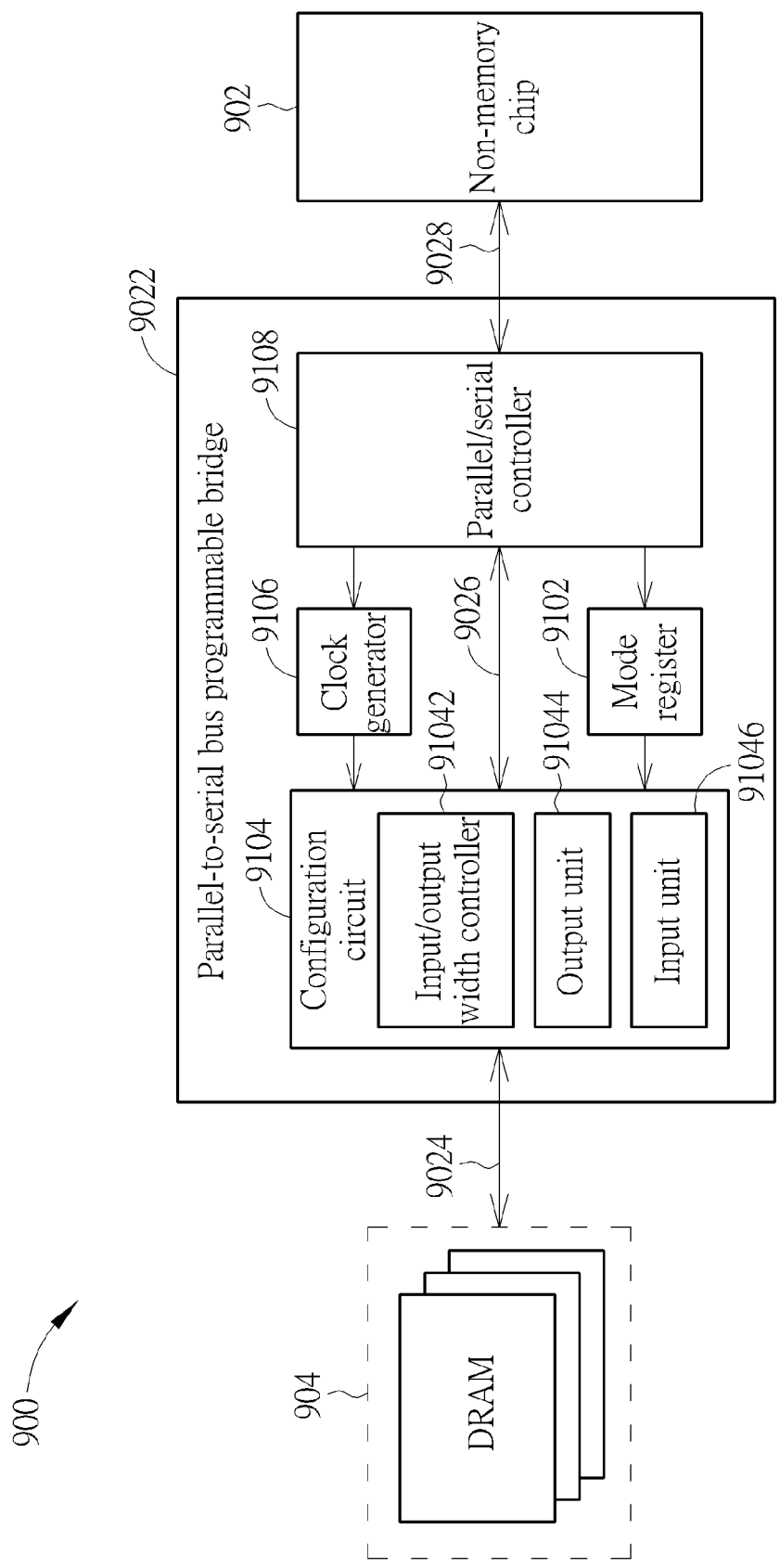
FIG. 9 is a diagram illustrating a SIP module with memory according to a tenth embodiment.

Please refer to FIG. 9. FIG. 9 is a diagram illustrating a SIP module 900 with memory according to a tenth embodiment. As shown in FIG. 9, a parallel-to-serial bus programmable bridge 9022 of the SIP module 900 includes a mode register 9102, a configuration circuit 9104, a clock generator 9106, and a parallel/serial controller 9108. The mode register 9102 can be set by the non-memory chip 902 (e.g. a central processing unit), and the configuration circuit 9104 of the parallel-to-serial bus programmable bridge 9022 can control and reconfigure a reconfigurable bus 9024 between a memory 904 and the configuration circuit 9104 according to contents of the mode register 9102. For example, when four DRAMs of 512Mx32 bit stacked/packed together in the memory 904, bus width of the reconfigurable bus 9024 between the memory 904 and the configuration circuit 9104 can be set as 32 bits, 64 bits, or 128 bits, and address width of the reconfigurable bus 9024 can be accordingly set as 2G, 1G, or 512M, respectively.

As shown in FIG. 9, the configuration circuit 9104 includes an input/output width controller 91042, an output unit 91044, and an input unit 91046. The input/output width controller 91042 can access the contents of the mode register 9102 and configure the reconfigurable bus 9024 between the memory 904 and the configuration circuit 9104. Therefore, the present invention can realize different bus width configurations between the memory 904 (virtual external cache memory) and the non-memory chip 902. For example, in one embodiment of the present invention, a bus width of the reconfigurable bus 9024 is configured as M bits and a swing voltage (which is equal to the voltage difference between the logic-high "1" and the logic-low "0") of the reconfigurable bus 9024 is configured as 1.8V, and the output unit 91044 of the configuration circuit 9104 receives M bits data from the memory 904 (virtual external cache memory) and simultaneously outputs the M bits data to the parallel/serial controller 9108 according to a first clock signal of the clock generator 9106. For power saving purpose, the output unit 91044 can reduce a swing voltage of the M bits data from 1.8V to 1.2V (or lower) and generate M bits data with 1.2V swing voltage to the parallel/serial controller 9108 through a reconfigurable bus 9026 between the parallel/serial controller 9108 and the configuration circuit 9104. The parallel/serial controller 9108 receives the M bits data with 1.2V swing voltage (parallel M bits data with 1.2V swing voltage), and according to a second clock signal generated by the clock generator 9106, converts the parallel M bits data with 1.2V swing voltage into a set of serial data which is in compliance with a high speed serial bus protocol (such as Universal Serial Bus (USB) 3.0 format or Peripheral Component Interconnect Express (PCIe) format), and transmits the set of serial data to the non-memory chip 902 (central processing unit) through a high speed serial bus 9028.

On the other hand, the non-memory chip 902 (central processing unit) can transmit a set of high speed serial data (such as USB 3.0 data or PCIe data) to the parallel/serial controller 9108 of the parallel-to-serial bus programmable bridge 9022, and then the parallel/serial controller 9108 converts the set of highspeed serial data into parallel M bits data with 1.2V swing voltage. The parallel/serial controller 9108 transmits the parallel M bits data with 1.2V swing voltage to the input unit 91046 through the reconfigurable bus 9026, and the input unit 91046 can increase a swing voltage of the parallel M bits data with 1.2V swing voltage from 1.2V to 1.8V, and transmit the parallel bits data with 1.8V swing voltage to the memory 904 (virtual external cache memory) through the reconfigurable bus 9024 between the parallel-to-serial bus programmable bridge 9022 and the memory 904 (virtual external cache memory).

Figure 10:
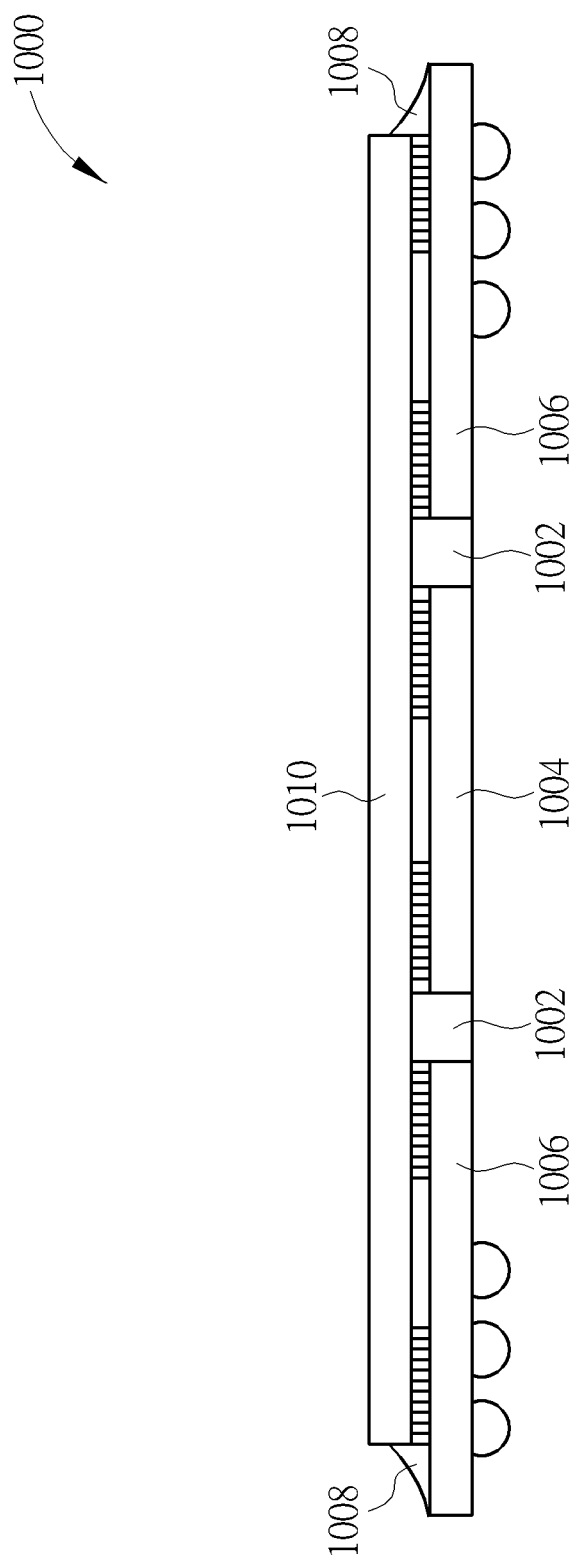
FIG. 10 is a diagram illustrating a SIP module with memory according to an eleventh embodiment.

Please refer to FIG. 10. FIG. 10 is a diagram illustrating a SIP module 1000 with memory according to an eleventh embodiment. As shown in FIG. 10, a resin (other package materials) 1002 can be inserted into space between a memory 1004 and a substrate 1006. In addition, a resin 1008 can be installed on edges of a non-memory chip 1010 to seal the edges of the non-memory chip 1010.

Figure 11:
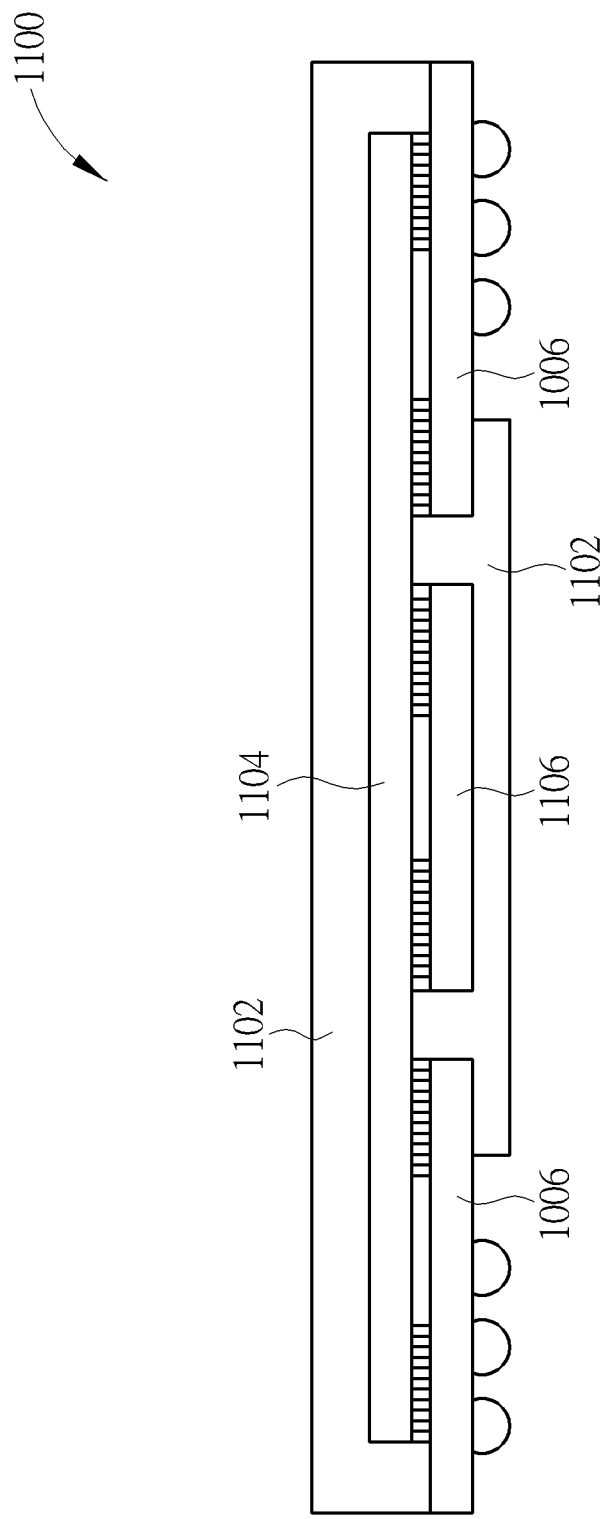
FIG. 11 is a diagram illustrating a SIP module with memory according to a twelfth embodiment.

Please refer to FIG. 11. FIG. 11 is a diagram illustrating a SIP module 1100 with memory according to a twelfth embodiment. As shown in FIG. 11, a resin (other package materials) 1102 can encapsulate both a non-memory chip 1104 and a memory 1106.

Figure 12:
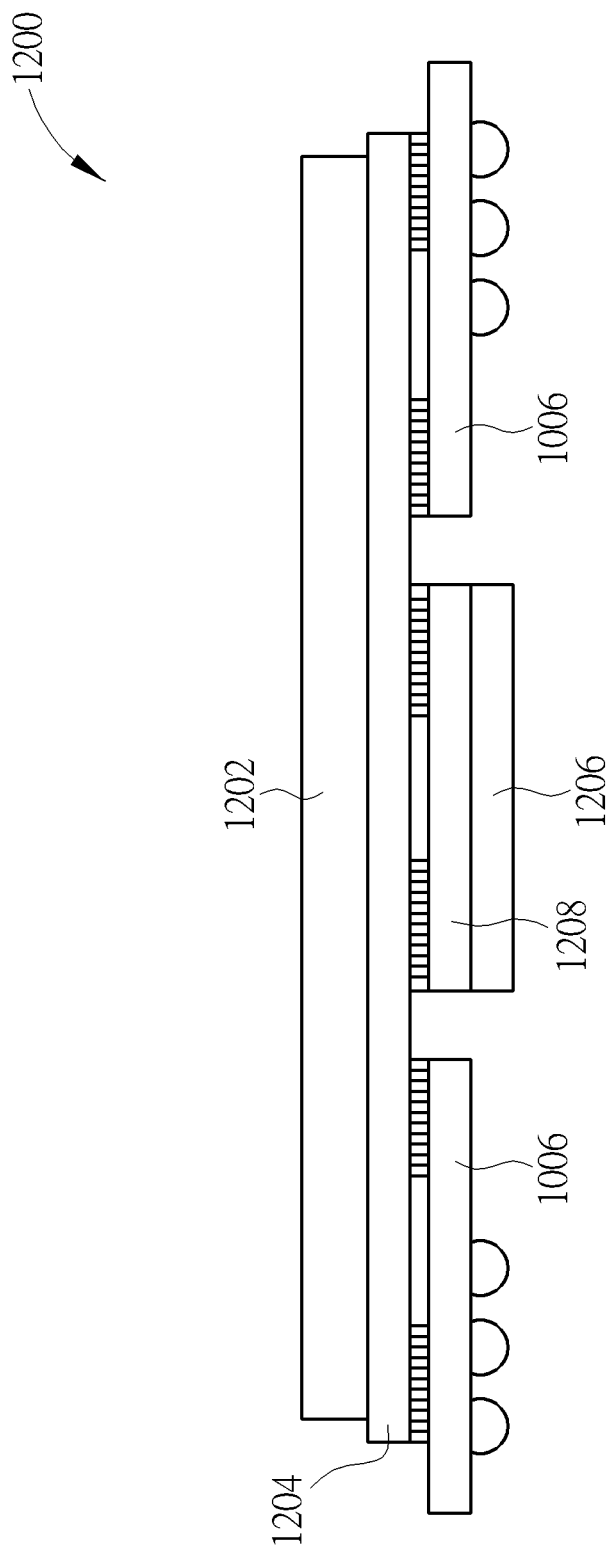
FIG. 12 is a diagram illustrating a SIP module with memory according to a thirteenth embodiment.

Please refer to FIG. 12. FIG. 12 is a diagram illustrating a SIP module 1200 with memory according to a thirteenth embodiment. As shown in FIG. 12, a first heat sink 1202 is coupled to a non-memory chip 1204 to expedite heat dissipation of the non-memory chip 1204, and a second thermal dissipation material 1206 is coupled to a memory 1208 to expedite heat dissipation of the memory 1208, wherein the second thermal dissipation material 1206 is a thermal paste.

Figure 13A:
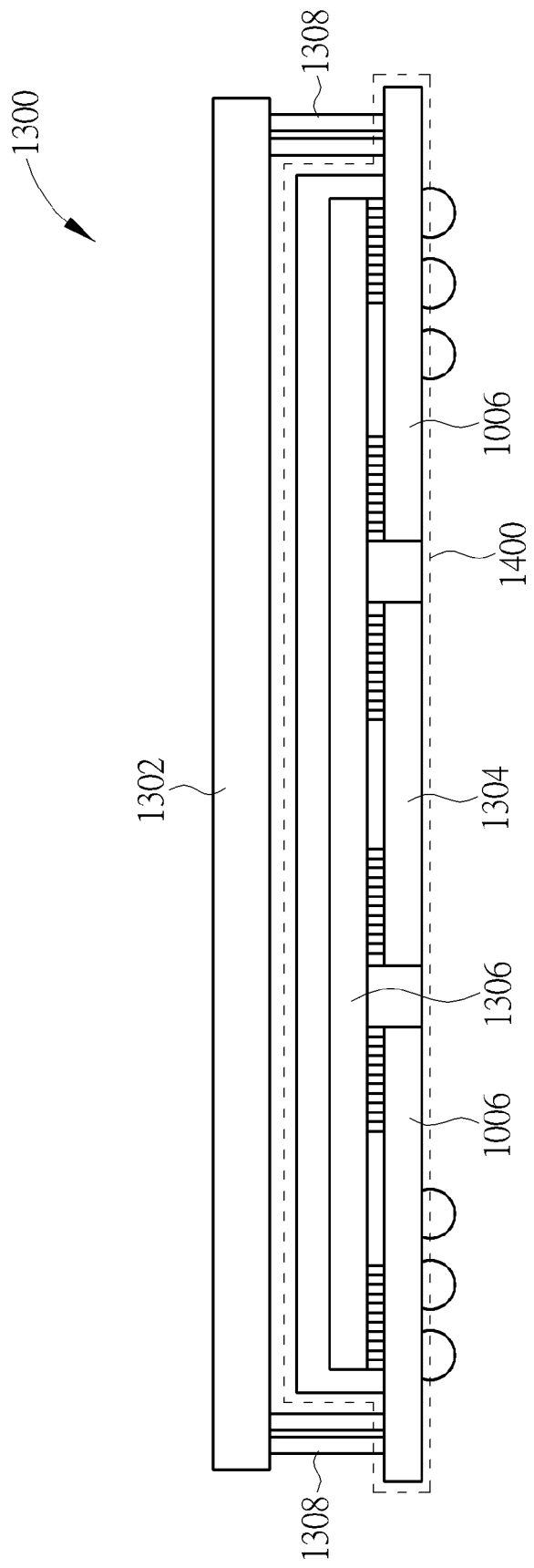
FIG. 13A is a diagram illustrating a SIP module with memory according to a fourteenth embodiment.
Figure 13B:
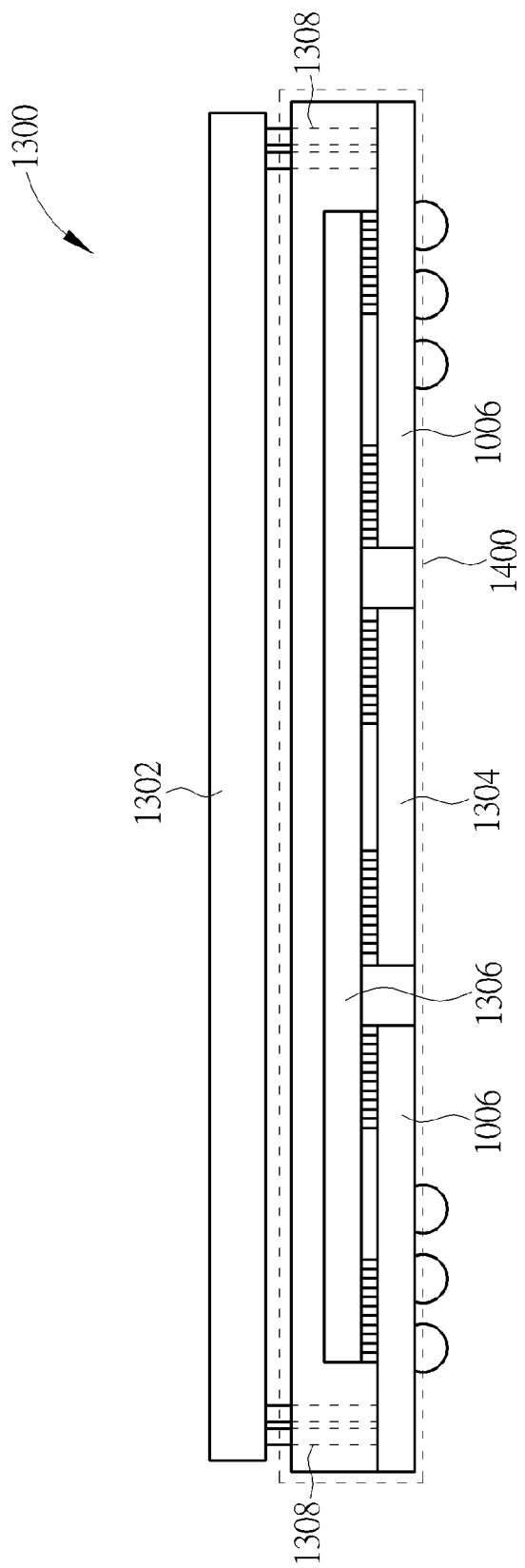
FIG. 13B is a diagram illustrating a SIP module with memory according to a fifteenth embodiment.

Please refer to FIG. 13A. FIG. 13A is a diagram illustrating a SIP module 1300 with memory according to a fourteenth embodiment. As shown in FIG. 13A, an additional memory 1302 covers a system-in-package module 1400 with memory), and the structure shown in FIG. 13A is called as package on package (POP). As shown in FIG. 13A, the additional memory 1302 can be a regular DRAM or stacked DRAM. In FIG. 13A, a memory 1304 is an external cache memory of a non-memory chip 1306 within the SIP module 1400, and the additional memory 1302 can act as a main memory of the non-memory chip 1306 within the SIP module 1400. In addition, as shown in FIG. 13A, there are electrical contacts 1308 between the additional memory 1302 and the SIP module 1400. In addition, as shown in FIG. 13B, the electrical contacts 1308 penetrate the SIP module 1400.

To sum up, the system-in-package module with memory integrates a memory, a non-memory chip (logic IC), and a substrate into a system-in-package, so the present invention can reduce an area of the SIP module. In addition, because the SIP module provided by the present invention can be customized to respond various different memories and non-memories (logic ICs), the SIP module provided by the present invention has optimal performance, efficiency, or cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system-in-package module with memory, the SIP module comprising:
   a non-memory chip having a first portion and a second portion;
   a substrate having a window and electrically connected to the second portion of the non-memory chip; and
   a memory chip installed into the window of the substrate to electrically connect the first portion of the non-memory chip;
   wherein there is no direct metal connection between the memory chip and the substrate, and there is gap between the memory chip and the substrate, and the gap is filled with resin.

2. The SIP module of claim 1, wherein the memory is a DRAM or a plurality of DRAM stacked together, and the non-memory chip is a logic integrated circuit (IC).

3. The SIP module of claim 1, further comprising:
   a memory controller accessing data of the non-memory chip or the memory according to commands of the SIP module, correcting data errors stored in the non-memory chip or the memory, or dynamically changing a combination of an operation voltage, an operation frequency, or a bus width of the SIP module.

4. The SIP module of claim 1, wherein the non-memory chip comprises a plurality of cores, wherein each core of the plurality of cores comprises at least one first cache memory, and an additional second cache memory shared by the each core of the plurality of cores.

5. The SIP module of claim 1, further comprising:
   a parallel-to-serial bus programmable bridge;
   a first reconfigurable bus coupled between the parallel-to-serial bus programmable bridge and the memory, wherein the first reconfigurable bus is a parallel bus; and a second reconfigurable bus coupled between the parallel-to-serial bus programmable bridge and the non-memory chip, wherein the second reconfigurable bus is a serial bus;

wherein a bus width and an address width of the first reconfigurable bus is dynamically changed, or a bus width and an address width of the second reconfigurable bus is dynamically changed.

6. The SIP module of claim 1, further comprising:
a resin installed on edges of the non-memory chip to seal the edges of the non-memory chip.

7. The SIP module of claim 1, further comprising:
a resin encapsulating the non-memory chip and the memory.

8. The SIP module of claim 1, further comprising:
a first heat sink coupled to the non-memory chip to expedite heat dissipation of the non-memory chip; and
a second thermal dissipation material coupled to the memory to expedite heat dissipation of the memory.

9. The SIP module of claim 8, wherein the second thermal dissipation material is a thermal paste.

10. The SIP module of claim 1, further comprising:
an additional memory covering the non-memory chip, the memory, and the substrate, a plurality of electrical contacts exist between the additional memory and a package packaging the non-memory chip and the memory, and the additional memory is a DRAM or stacked DRAMs.

11. The SIP module of claim 10, wherein the plurality of electrical contacts penetrate the package packaging the non-memory chip and the memory.

\* \* \* \* \*